United States Patent
Kalabic et al.

(10) Patent No.: US 10,324,446 B2
(45) Date of Patent: Jun. 18, 2019

(54) SYSTEM AND METHOD FOR CONTROLLING REDUNDANT ACTUATORS WITH DIFFERENT DYNAMICS

(71) Applicant: Mitsubishi Electric Research Laboratories, Inc., Cambridge, MA (US)

(72) Inventors: Uros Kalabic, Jamaica Plain, MA (US); Abraham Goldsmith, Boston, MA (US); Stefano Di Cairano, Newton, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 149 days.

(21) Appl. No.: 15/447,448

(22) Filed: Mar. 2, 2017

(65) Prior Publication Data
US 2018/0253076 A1    Sep. 6, 2018

(51) Int. Cl.
G05B 19/19     (2006.01)
G05B 19/23     (2006.01)
(Continued)

(52) U.S. Cl.
CPC ............ *G05B 19/23* (2013.01); *G05B 19/19* (2013.01); *G05B 2219/39221* (2013.01);
(Continued)

(58) Field of Classification Search
CPC ..................................................... G05B 19/23
See application file for complete search history.

(56) References Cited

U.S. PATENT DOCUMENTS

| | | | |
|---|---|---|---|
| 5,262,707 A | 11/1993 | Okazaki et al. | |
| 5,452,275 A | 9/1995 | Ogawa | |

(Continued)

FOREIGN PATENT DOCUMENTS

| | | |
|---|---|---|
| WO | 2013108569 A1 | 7/2013 |
| WO | 2015125747 A1 | 8/2015 |
| WO | 2016163311 A1 | 10/2016 |

OTHER PUBLICATIONS

Hsu et al. "Dynamic Control of Redundant Manipulators," American Control Conference, Jun. 15, 1988, IEEE, pp. 2135-2139.
(Continued)

*Primary Examiner* — Thomas C Lee
*Assistant Examiner* — Anzuman Sharmin
(74) *Attorney, Agent, or Firm* — Gennadiy Vinokur; James McAleenan; Hironori Tsukamoto

(57) ABSTRACT

A laser processing system includes redundant actuators positioning a laser spot on a workpiece. The system determines a first trajectory of the first actuator minimizing motion of the first actuator that positions the second actuator such that each point of the reference trajectory is within a range of the second actuator and determines a second trajectory of the second actuator based on a difference between the reference trajectory and the first trajectory. For each axis of control, the system determines an envelope centered on the reference trajectory with a width not greater than the range of the second actuator and determines shortest trajectory traversing the envelope along the time domain to produce the first trajectory. Hence, the first trajectory includes a set of straight segments satisfying the constraints defined by the shape of the envelope. The system includes controllers for control the motion of redundant actuators.

15 Claims, 14 Drawing Sheets

(51) Int. Cl.
*G05F 1/00* (2006.01)
*H03B 1/00* (2006.01)
*H03B 9/00* (2006.01)

(52) U.S. Cl.
CPC ...... *G05B 2219/45041* (2013.01); *G05F 1/00* (2013.01); *H03B 1/00* (2013.01); *H03B 9/00* (2013.01)

(56) References Cited

U.S. PATENT DOCUMENTS

| | | |
|---|---|---|
| 5,751,585 A | 5/1998 | Cutler et al. |
| 5,798,927 A | 8/1998 | Cutler et al. |
| 5,801,939 A | 9/1998 | Okazaki |
| 6,313,433 B1 | 11/2001 | Sukman et al. |
| 6,496,292 B2 | 12/2002 | Fillion et al. |
| 6,706,998 B2 | 3/2004 | Cutler |
| 6,786,999 B2 | 9/2004 | Goodnow et al. |
| 7,050,208 B2 | 5/2006 | Overbeck et al. |
| 7,245,412 B2 | 7/2007 | Bruland et al. |
| 7,315,038 B2 | 1/2008 | Bruland |
| 7,710,060 B2 | 5/2010 | Cardinale et al. |
| 9,170,580 B2 * | 10/2015 | Shilpiekandula ...... G05B 19/19 |
| 2011/0102937 A1 * | 5/2011 | Argumedo ............ G11B 5/584 360/77.12 |
| 2013/0190898 A1 | 7/2013 | Shilpiekandula et al. |
| 2015/0241865 A1 * | 8/2015 | Haghighat ........... G05B 19/195 700/166 |

OTHER PUBLICATIONS

Naghshineh et al. "Actuator Saturation Avoidance in Overactuated Systems," Intelligent Robots and Systems, Proceedings, IEEE RSJ International Conference on Sendai, Japan. Sep. 28-Oct. 2, 2004. pp. 3613-3618.

* cited by examiner

SYSTEM AND METHOD FOR CONTROLLING REDUNDANT ACTUATORS WITH DIFFERENT DYNAMICS

TECHNICAL FIELD

This invention relates generally to coordinated control of machines with redundant actuators for positioning a controlled parameter, and more particularly to control of the redundant actuators with different dynamics.

BACKGROUND

A processing machine with redundant actuators includes multiple actuators for jointly positioning a controlled parameter. For example, the controlled parameter can be a position of a worktool along each axis of motion, and the joint motion of the redundant actuators position such a worktool. In a number of implementations, the position of the worktool is the algebraic sum of the position of at least a first actuator and a position of a second actuator of the redundant actuators. Thus, the machine is over-actuated, and degrees of freedom are available to optimize the movement of the worktool along a desired processing pattern. The worktool can be positioned by independent operations of the redundant actuators, and thus the task of positioning the worktool along the processing pattern can be separated between redundant actuators. One example of such a machine is a laser processing machine with redundant actuators, in which the worktool is a laser beam.

Some conventional methods, see, e.g., U.S. Pat. Nos. 5,452,275 and 7,710,060, use frequency separation techniques to assign the task of positioning the laser beam to the redundant actuators. For example, a low pass filter filters the processing pattern. The filtered signal becomes a reference trajectory for one actuator, while a difference between the processing pattern and the filtered signal becomes a reference trajectory for another actuator. In those methods, the redundant actuators jointly and supportively position the worktool.

SUMMARY

Some embodiments are based on the recognition that redundant actuators with different dynamics can be cooperatively controlled to contribute to positioning the controlled parameter along a reference trajectory. For example, a first actuator with dynamics slower than dynamics of a second actuator can increase the operational range of the fast actuator, but also can be controlled to reduce the burden of the fast actuator in tracking the reference trajectory. In such a manner, the redundant actuators share the burden of positioning a control parameter along the reference trajectory.

However, in some situations the motion of the slow actuator is undesirable. For example, in systems with a significant difference between dynamics of the slow and the fast actuators, the motion of the slow actuator does not appreciably increase throughput of the system, and introduces undesirable vibrations that needs to be counteracted by the control of the fast actuator.

To that end, some embodiments are based on the realization that in such systems the slow actuator should only be used to increase the range of the fast actuator, but do nothing else even if the slow actuator can help further. For example, the slow actuator should not move if the fast actuator could track the entire reference trajectory without help from the slow actuator.

For example, the above-mentioned situation can be beneficial for systems having dynamics of the fast actuator at least one order of magnitude faster than dynamics of the slow actuator. For example, such a difference of the dynamics can be present in laser-processing machines controlling a position of a laser spot on a workpiece. In an exemplar laser-processing machine, the fast actuator includes a galvano mirror assembly to direct the laser beam at different locations on the workpiece, and the slow actuator includes a platform to change the relative positions of the galvano mirror assembly with respect to the workpiece. In some implementations, the velocity of mirrors of the galvano mirror assembly is greater than the velocity of the motion of the platform by about an order of magnitude, and the acceleration of the mirrors of the galvano mirror assembly is greater by at least three orders of magnitude than the acceleration of the motion of the platform.

To that end, some embodiments determine the shortest trajectory for the motion of the slow actuator that places the reference trajectory within reach of the fast actuator. The trajectory of the fast actuator is based on the difference between the trajectory of the first actuator and the reference trajectory. In such a manner, the cooperative control of the redundant actuators is simplified, while ensuring the feasibility of the trajectories enables the joint motions of the redundant actuators to position the controlled parameter of the system along the reference trajectory.

The reference trajectory represents a path in space parameterized by time, which the controlled parameter of the system, e.g., coordinates of the spot projected by the laser beam, has to follow to within an error tolerance. A feasible trajectory is a trajectory that the machine can follow within an error tolerance.

Some embodiments are based on realization that the shortest feasible trajectory for the slow actuator is a monotonic function of time contained within an envelope that is centered on the reference trajectory and has the width of the range of the fast actuator. For example, the shortest trajectory is any trajectory within a region flanked by a forward-looking trajectory and a backward-looking trajectory. The forward-looking and the backward-looking trajectories move the slow actuator only when required by the shape of the envelope constraining the motion of the slow actuator. However, the forward-looking trajectory moves the slow actuator between two neighboring stationary positions of the slow actuator as soon as possible, while the backward-looking trajectory moves the slow actuator between the two neighboring stationary positions as late as possible.

In some embodiments, the backward-looking trajectory holds the position of the slow actuator constant unless this causes the slow actuator to leave the constraint envelope; otherwise the position follows the immediate bound of the constraint envelope. When viewed backwards-in-time, the forward-looking trajectory holds the position of the slow actuator constant unless this would cause the slow actuator to leave the constraint envelope; otherwise the position follows the immediate bound of the constraint envelope backwards-in-time.

Accordingly, one embodiment discloses a system for positioning a controlled parameter according to a reference trajectory. The system includes redundant actuators including at least a first actuator and a second actuator arranged such that joint motions of the first actuator and the second actuator position the controlled parameter of the system; a memory to store the reference trajectory including a sequence of points defining positions of the controlled parameter of the system as a function of time; a trajectory generator including a processor to determine a first trajectory of the first actuator minimizing the motion of the first actuator that positions the second actuator such that each point of the reference trajectory is within a range of the second actuator and to determine a second trajectory of the second actuator based on a difference between the reference trajectory and the positions the second actuator with respect to the reference trajectory governed by the first trajectory enabling the joint motions of the first actuator and the second actuator to position the controlled parameter of the system along the reference trajectory; a first controller for controlling the motion of the first actuator according to the first trajectory; and a second controller for controlling the motion of the second actuator according to the second trajectory.

Another embodiment discloses a method for controlling a joint motion of redundant actuators including a first actuator and a second actuator to position a controlled parameter according to a reference trajectory including a sequence of points defining positions of the controlled parameter of the system as a function of time, wherein steps of the method are performed by a processor connected to a memory storing the reference trajectory and coupled with stored instructions implementing the method, wherein the instructions, when executed by the processor carry out at least some steps of the method including determining, for an axis of control, an envelope bounding a first trajectory of the first actuator with respect to the reference trajectory in at least the axis of control and time domains, wherein the envelope is centered on the reference trajectory with a width not greater than a range of the second actuator; determining the shortest trajectory traversing the envelope along the time domain to produce the first trajectory of the first actuator; determining a second trajectory of the second actuator based on a difference between the reference trajectory and the positions the second actuator with respect to the reference trajectory governed by the first trajectory enabling the joint motions of the first actuator and the second actuator to position the controlled parameter of the system along the reference trajectory; and causing the first actuator to move according to the first trajectory and causing the second actuator to move according to the second trajectory.

Yet another embodiment discloses a non-transitory computer readable storage medium embodied thereon a program executable by a processor for performing a method for controlling a joint motion of redundant actuators including a first actuator and a second actuator to position a controlled parameter according to a reference trajectory including a sequence of points defining positions of the controlled parameter of the system as a function of time. The method includes determining, for an axis of control, an envelope bounding a first trajectory of the first actuator with respect to the reference trajectory in at least the axis of control and time domains, wherein the envelope is centered on the reference trajectory with a width not greater than a range of the second actuator; determining the shortest trajectory traversing the envelope along the time domain to produce the first trajectory of the first actuator; determining a second trajectory of the second actuator based on a difference between the reference trajectory and the positions the second actuator with respect to the reference trajectory governed by the first trajectory enabling the joint motions of the first actuator and the second actuator to position the controlled parameter of the system along the reference trajectory; and causing the first actuator to move according to the first trajectory and causing the second actuator to move according to the second trajectory.

DETAILED DESCRIPTION

Figure 1A:
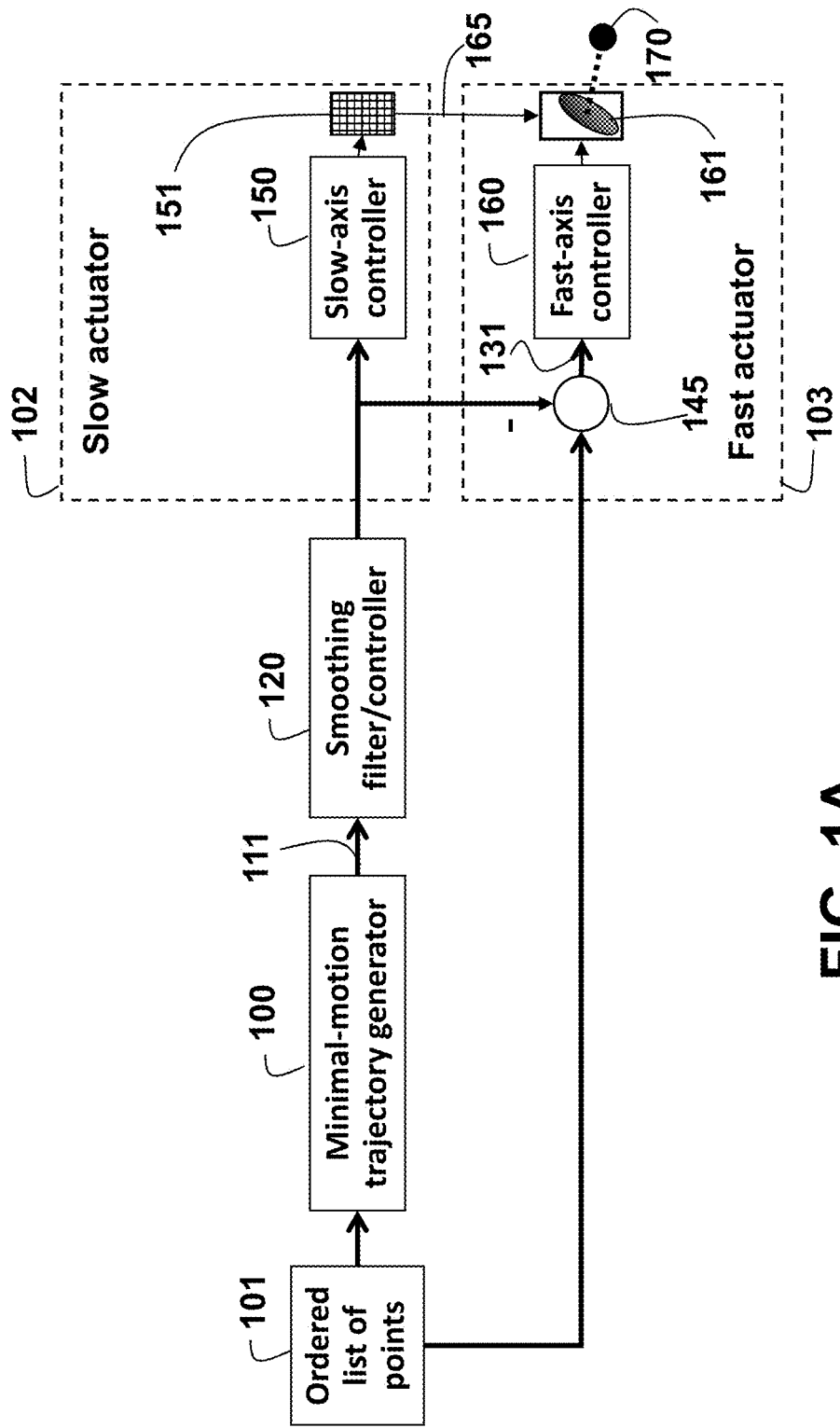
FIG. 1A show a block diagram of a system for positioning a controlled parameter to track a reference trajectory according to some embodiments.

FIG. 1A show a block diagram of a system for positioning a controlled parameter to track a reference trajectory according to some embodiments. The system includes redundant actuators, e.g., a first actuator 102 and a second actuator 103 arranged such that joint motions of the first actuator and the second actuator position the controlled parameter of the system. In various embodiments, the dynamics of the second actuator is faster than dynamics of the first actuator. To that end, the first actuator is also referred herein as a slow actuator and the second actuator is referred herein as the fast actuator.

In some implementations, the slow and the fast actuators are part of a laser-processing machine. In those embodiments, the controlled parameter of the system is a position of a laser beam 170 on a workpiece processed by the laser-processing machine. Examples of the laser processing machine include one or a combination of a laser drilling, a laser cutting, a laser marking, a laser scribing, a laser direct imaging, and an electron beam processing machine.

For example, in one embodiment, the fast actuator includes a galvano mirror assembly 161 to direct the spot of the laser beam at different locations on the workpiece. In one embodiment, the slow actuator includes a platform 151 that moves to position the galvano mirror assembly relative to the workpiece. In some implementations, the velocity of mirrors of the galvano mirror assembly is greater than the velocity of the motion of the platform by about an order of magnitude, and the acceleration of the mirrors of the galvano mirror assembly is greater by at least three orders of magnitude the acceleration of the motion of the platform.

Figure 1B:
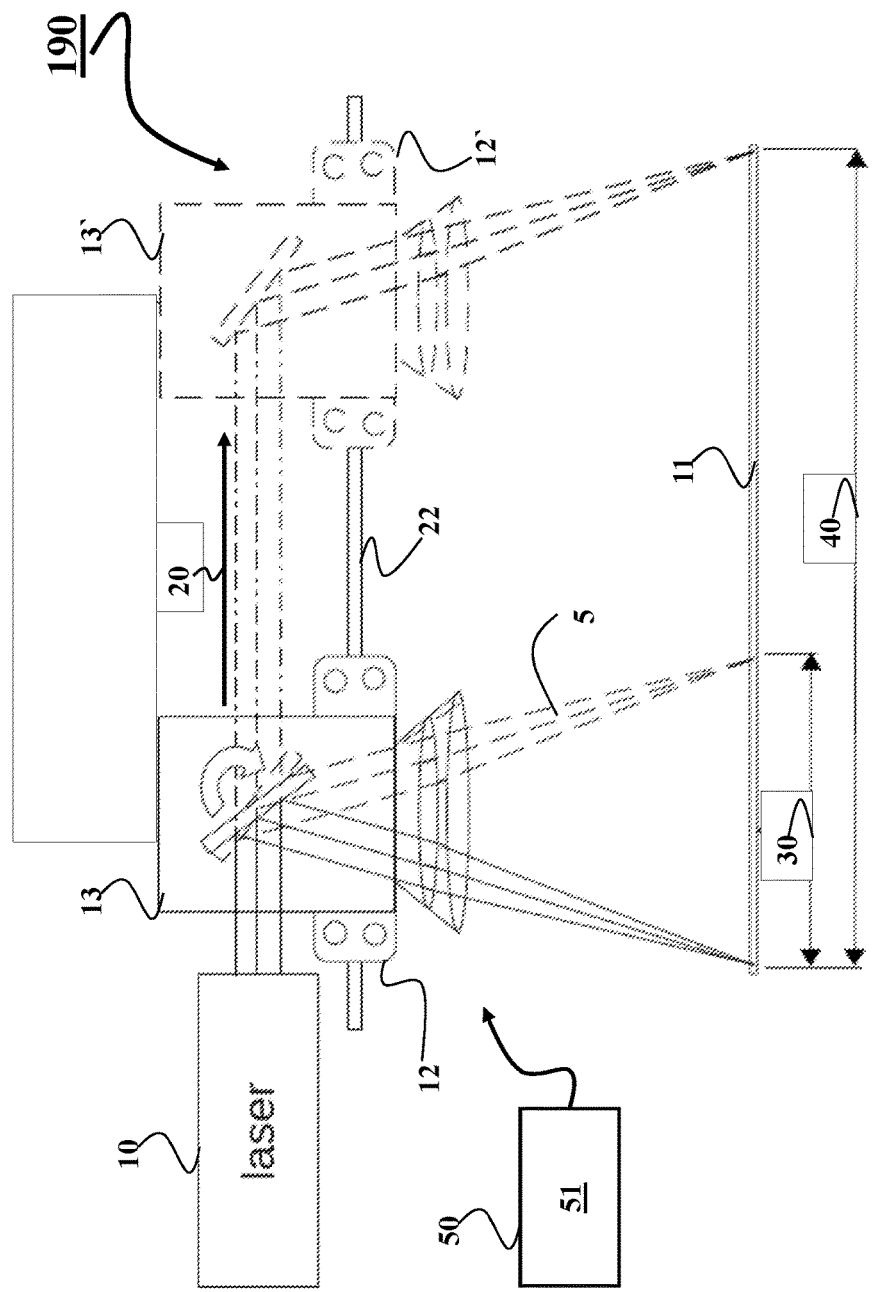
FIG. 1B shows a block diagram of an exemplar laser-processing machine suitable for controlling a position of a laser beam according to principles employed by some embodiments.

FIG. 1B shows a block diagram of an exemplar laser-processing machine 190 suitable for controlling a position of a beam produced by a laser 10 on a workpiece 11 according to principles employed by some embodiments. The laser-processing machine includes a platform 12 configured to move along at least a first direction 20. The platform is moved by a motion system 22 for moving the platform in a plane parallel to the workpiece. In one embodiment, the motion system 22 includes a first prismatic joint facilitating a first motion of the platform along the first direction 20.

The laser-processing machine also includes a galvano assembly 13 arranged on the platform 12, such that the motion of the platform along the first direction 20 causes a motion of the galvano along the first direction. For example, the galvano can include a reversible DC motor, equipped with a mirror on an output shaft, and usually with built-in bump stops, to limit rotation of the mirror to a small angle, typically +/−20 to 30 degrees about the center. Such galvano assemblies are often sold as complete units.

For example, the motion of the platform to a position 12' moves the galvano to a position 13'. Also, an operation of the galvano directs the laser beam to the workpiece along at least a second direction 30. The galvano is arranged on the platform such that the second direction 30 is fixed with respect to the first direction 20, which allows directing the laser beam concurrently along the first direction and along the second direction. In various embodiments, the position of the laser beam on the workpiece is a vector sum 40 of the first motion, and the second motion. The motion of the platform and the operation of the galvano are controlled by a control module 50. The control module 50 can be implemented using a processor 51.

Such arrangement of the galvano on the platform precludes mechanical crashes of the galvano with the platform during the operation of the laser-processing machine and allows for simplification of the controlling operation of the laser-processing machine. Moreover, such arrangement allows for summing the motions of the galvano and the platform to reduce the time required for the laser cutting.

Other variations of the design of the laser cutting machine of FIG. 1B are possible and within the scope of various embodiments. For example, in some embodiments, the platform is configured to move in two directions and the motion system 22 includes a first prismatic joint facilitating a first motion of the platform along a first direction and a second prismatic joint facilitating a second motion of the platform along a second direction. Similarly, the galvano assembly may include a first mirror, wherein a third motion of the first mirror positions the laser beam along a third direction, and a second mirror, wherein a fourth motion of the second mirror positions the laser beam along a fourth direction. In such embodiments, the control module 50 controls concurrently the motion system and the galvano, such that the position of the laser beam on the workpiece is a vector sum of the first motion, the second motion, the third motion, and the fourth motion.

Referring back to FIG. 1A, the slow actuator 102 includes a slow-axis controller 150, which controls the platform 151. Typically, the workpiece is mounted on the platform. The fast actuator 103 includes a fast-axis controller 160, which controls a galvano mirror assembly 161. In combination, the slow and fast actuators position the spot of the laser beam 170 relative to the workpiece on the table. The spot of the laser beam is the location of the laser that, through heating of the workpiece, machines a desired pattern into the workpiece. In a system with "flying optics", besides the mirror moving, the optical assembly is moved on the platform, while the workpiece is stationary. In yet an alternative embodiment, the optical assembly (other than the mirror itself) is stationary, and the platform and the workpiece are moved.

Various embodiments work with different configurations of the systems for positioning the controlled parameter. For example, the controllers 150 and 160 can be implemented integral or external to the actuators 102 and 103. For example, the platform 151 and the galvano assembly 161 can be replaced with different mechanisms enabling the relative motion between a laser and a workpiece.

In various configurations, the redundant actuators are arranged such that joint motions of the slow actuator and the fast actuator position the controlled parameter, e.g., the laser beam, according to a reference trajectory 101. The reference trajectory includes a sequence of points defining positions of the controlled parameter of the system as a function of time. In various implementations, the motion of the slow actuator places the fast actuator with respect to the reference trajectory such that each point of the reference trajectory is within a range of the fast actuator enabling the joint motions of the slow actuator and the fast actuator to position the controlled parameter of the system along the reference trajectory.

Some embodiments are based on recognition that redundant actuators with different dynamics can be controlled cooperatively to contribute to positioning the controlled parameter along a reference trajectory. For example, a slow actuator with dynamics slower than dynamics of a fast actuator can increase the operational range of the fast actuator, but also can be controlled to reduce the burden of the fast actuator in tracking the reference trajectory. In such a manner, the redundant actuators can share the burden of positioning a control parameter along the reference trajectory.

However, in systems with a significant difference between dynamics of the slow and the fast actuators, as in the laser processing machines described above, the motion of the slow actuator does not appreciably increase throughput, but introduces undesirable vibrations that needs to be counteracted by the control of the fast actuator.

For example, the fast actuator can move with high velocities and accelerations and has a higher bandwidth than the slow actuator, but is limited by a relatively short stroke, i.e., the operating range. In contrast, the slow actuator has a relatively large stroke and can cover a larger area, but has a lower bandwidth and its accelerations and velocities are smaller than the accelerations and velocities of the fast actuator, e.g. the velocity by about one order of magnitude, and the acceleration by at least three orders. Due to the significant difference between the operating ranges of the fast and the slow actuators, the range of the fast actuator usually covers only a small portion of the workpiece. The slow actuator is able to cover the entire operating range.

Based on the above realizations, it is necessary for the slow actuator to follow a trajectory that ensures that the reference trajectory is always within operating range of the fast actuator. However, it is desirable for the slow actuator to move as little as possible. To that end, some embodiments are based on realization that in such systems the slow actuator should only be used to increase the range of the fast actuator, but do nothing else even if the slow actuator can help further. For example, the slow actuator should not move if the fast actuator could track the entire reference trajectory without help from the slow actuator. This amounts to generating a trajectory for the slow actuator that covers the minimal distance need to place the fast actuator within the reach of the reference trajectory.

To that end, the system of FIG. 1A includes a trajectory generator that determines a first trajectory 111 of the slow actuator 102 minimizing the motion of the slow actuator that positions the fast actuator such that each point of the reference trajectory 101 is within a range of the fast actuator. In such a manner, a second trajectory 131 of the fast actuator is determined based on a difference 145 between the reference trajectory 101 and the positions the fast actuator with respect to the reference trajectory governed by the first trajectory 111. Optionally, the system of FIG. 1A can include a filter 120 for smoothing the motion of the first actuator.

Figure 1C:
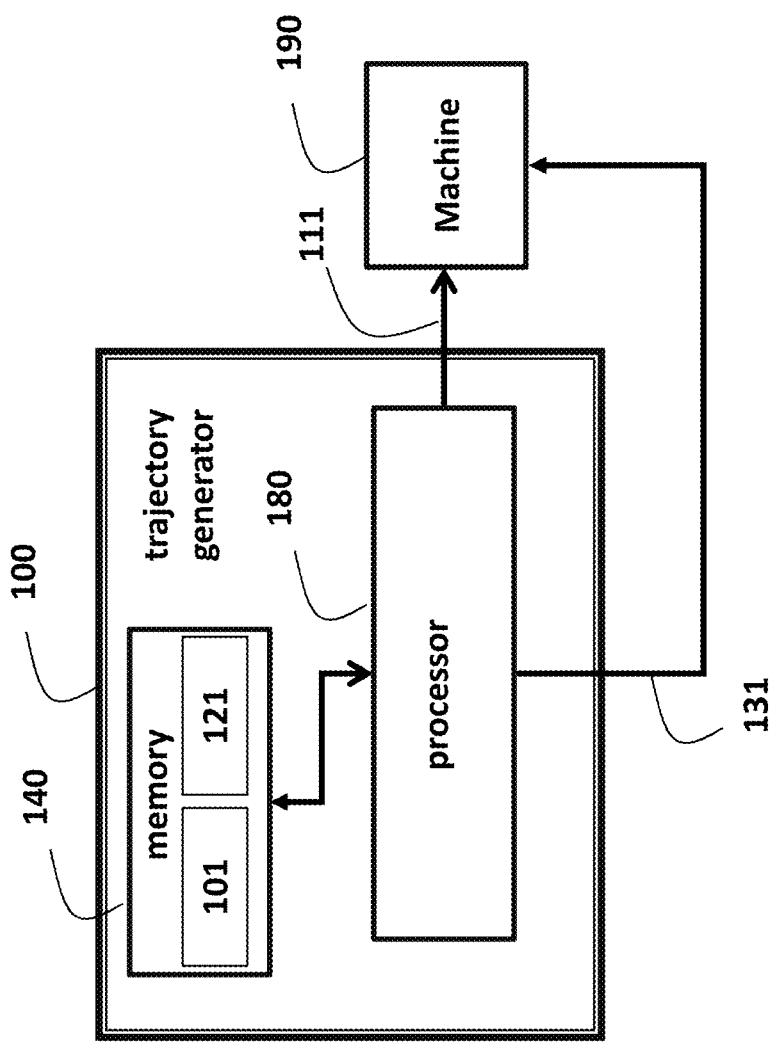
FIG. 1C shows a block diagram of an exemplar implementation of a trajectory generator of FIG. 1A according to one embodiment.

FIG. 1C shows a block diagram of an exemplar implementation of the trajectory generator 100 according to one embodiment. In this embodiment, the trajectory generator includes a processor 180 operatively connected to a memory 140. The memory 140 stores the reference trajectory 101 including a sequence of points defining positions of the controlled parameter of the system as a function of time. The memory can also store additional information 121 relevant for trajectory generation and/or the control of the machine 190. For example, the memory can store constraints on the operation of the laser-processing machine 190 as well as geometrical and physical arrangement of the fast and the slow actuator. The memory 140 can also store a program executable by the processor 180 for performing a method for controlling the joint motion of redundant actuators of the machine 190.

The reference trajectory can be stored in a memory and includes a sequence of points defining positions of the controlled parameter of the system as a function of time. For example, the input to the reference trajectory generator 100 can be an ordered list of points 101 to be drilled by the laser. The list of points is stored as N pairs of coordinates which represent positions of the laser spot on the workpiece $$(x_1,y_1),(x_2,y_2),\ldots,(x_N,y_N).$$

The reference trajectory generator receives the list of ordered point as an input and generates a reference trajectory 111 for the slow positioning subsystem as an output. The laser spot 170 is a function 145 of the positions of the slow and fast subsystems. Accordingly, the reference trajectories for the slow and fast subsystems satisfy the same functional relationship, i.e., $$x=f(x_{fast},x_{slow}),$$

$$y=f(y_{fast},y_{slow}),$$

where (x, y) is an element of the spot reference trajectory, and $(x_{slow}, y_{slow})$ and $(x_{fast}, y_{fast})$ are elements of the slow and fast reference trajectories, respectively.

This relationship between slow and fast positions can be approximated as a sum of the two inputs.

$$x=x_{fast}+x_{slow},$$

$$y=y_{fast}+y_{slow}$$

In one embodiment, this is done to simplify the subsequent computation of operating range. In alternative embodiment, the computation is performed without approximation, such that the function 145 is represented by a sum.

The fast actuator is limited by the physical distance of its range. Suppose that the range is equal to some value δ. Then the position of the fast actuator is limited to between a minimum value of −δ and a maximum value of +δ. The position of the slow actuator is the difference of the laser spot and the position of the fast actuator. Hence, this difference is also limited between a minimum value of −δ and a maximum value of +δ, as in $$-\delta \leq x-x_{slow} \leq +\delta,$$

$$-\delta \leq y-y_{slow} \leq +\delta.$$

To that end, the position of the controlled parameter is a function of positions of the slow- and fast-actuators, and can be approximated as the sum of the two. The operating range of the fast actuator can be superimposed on any point of the reference trajectory. When the superimposition is performed for each axis of control and for all points along the entire reference trajectory, the result is a two-dimensional envelope. This envelope is a constraint on the motion of the trajectory of slow actuator, i.e., the slow actuator moves through this envelope in order to ensure machining of the operating point.

Based on this realization, the generation of a minimal-path amounts to drawing a minimal-distance trajectory through this envelope. In one embodiment, the reference trajectory generator generates a minimal-distance trajectory for the slow actuator via the computation of the operating envelope. This slow-axis trajectory is passed to the slow actuator and the fast-axis trajectory, which is a function of the spot and slow-axis trajectories, is passed to the fast positioning subsystem.

Figure 2A:
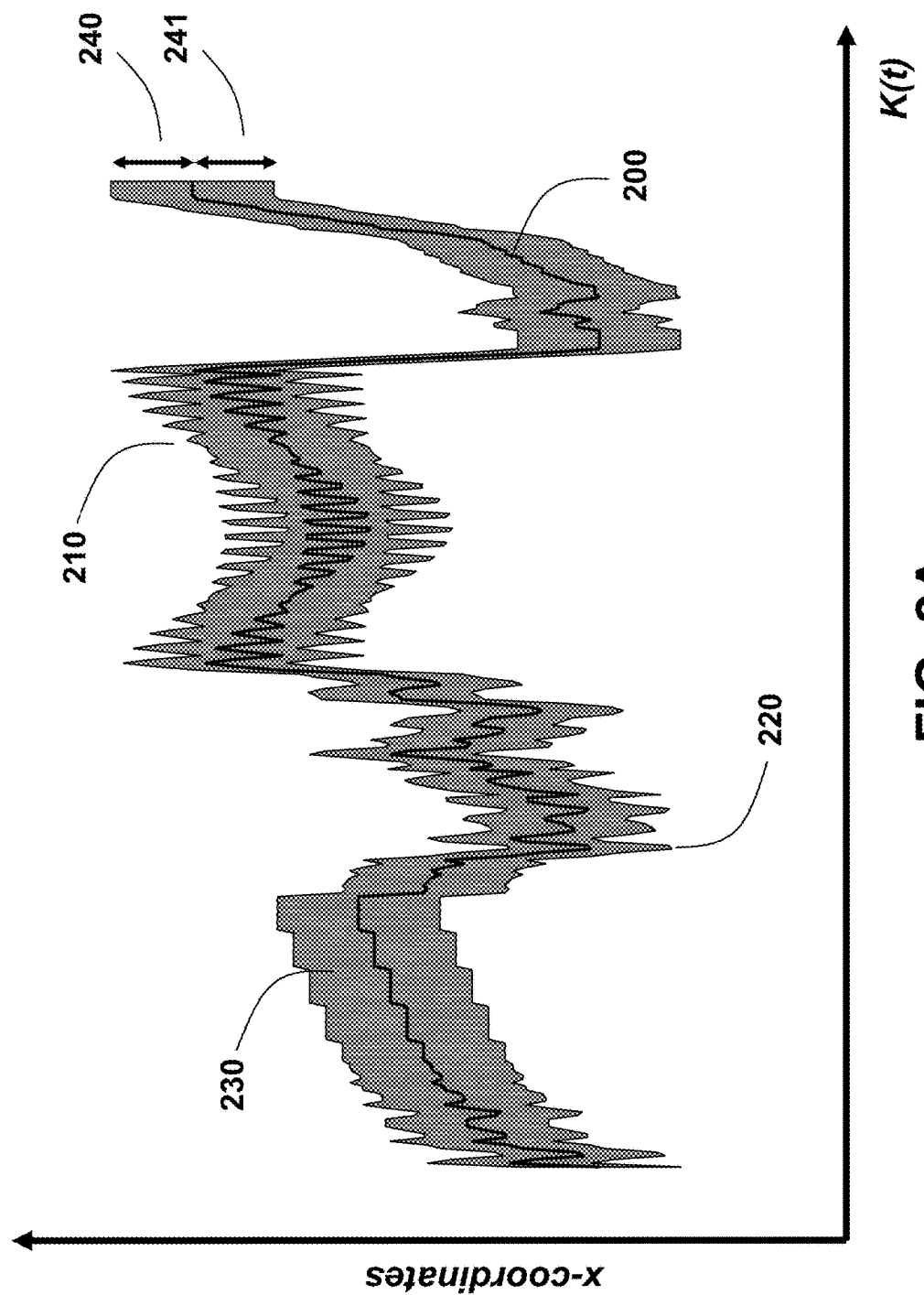
FIG. 2A shows a schematic of an envelope providing constraints for the motion of the slow actuator according to some embodiments.

FIG. 2A shows a schematic of the envelope 230 providing constraints for the motion of the slow actuator according to some embodiments. In this example, the envelope 230 is constructed for each axis, i.e., x-axis of the motion control. The envelope 230 is centered on the reference trajectory 200 with a width not greater than the range of the second actuator. Accordingly, each axis of the slow actuator is contained within an envelope 230 with a lower boundary 220 equal to the reference trajectory lowered by δ 241, and an upper boundary 210 equal to the reference trajectory raised by δ 240.

In some embodiments, the reference trajectory generator determines, using a processor, the shortest trajectory traversing the envelope along the time domain to produce the first trajectory for the motion of the slow actuator. The shortest trajectory minimizes the motion of the slow actuator while ensuring feasibility of tracking the reference trajectory.

Figure 2B:
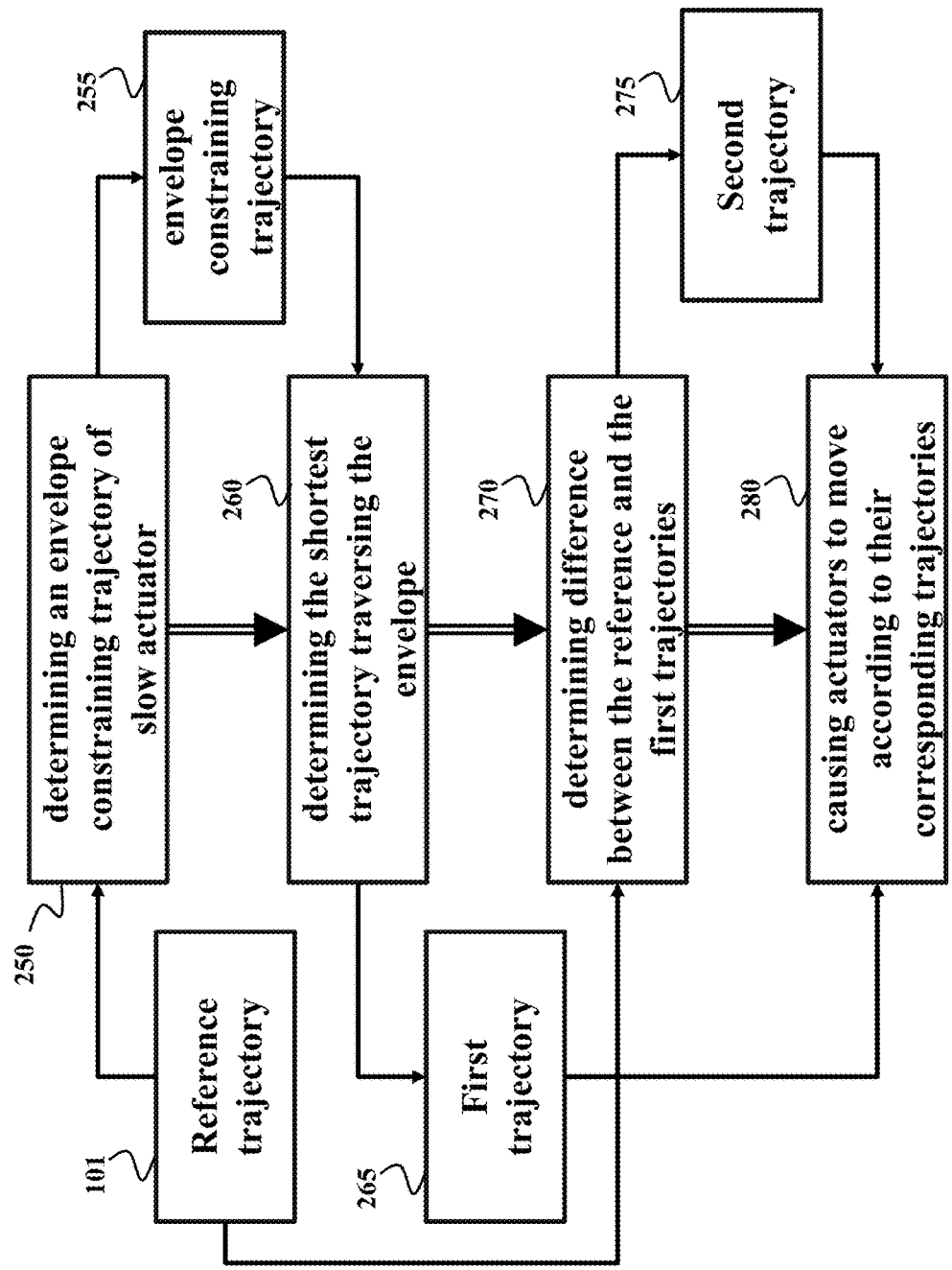
FIG. 2B shows a block diagram of a method for controlling a joint motion of redundant actuators according to some embodiments.

FIG. 2B shows a block diagram of a method for controlling a joint motion of redundant actuators according to some embodiments to position a controlled parameter according to a reference trajectory. The method can be implemented a processor connected to a memory storing the reference trajectory and coupled with stored instructions implementing the method, that, when executed by the processor carry out at least some steps of the method.

The method determines 250, for an axis of control, an envelope 255 bounding a first trajectory of the first actuator with respect to the reference trajectory 101 in at least the axis of control and time domains. The envelope defines is centered on the reference trajectory with a width not greater than a range of the second actuator and defines the constraints on the motion of the slow actuator. If the envelope is determined for one axis of control and/or separately for each axis of control, the envelope is two-dimensional, as shown in FIG. 2A. One axis of the two-dimensional envelope defines the control domain and another axis is time. Additionally, or alternatively, the envelope can be of a higher dimension if determined concurrently for multiple axis of control.

The method determines 260 the shortest trajectory traversing the envelope along the time domain to produce the first trajectory 265 of the slow actuator and determines 270 a second trajectory 275 of the fast actuator based on a difference between the reference trajectory and the positions the second actuator with respect to the reference trajectory governed by the first trajectory. In such a manner, the joint motion of the slow and the fast actuators enables positioning the controlled parameter of the system along the reference trajectory.

Next, the method causes 280 the first actuator to move according to the first trajectory and causes the second actuator to move according to the second trajectory. For example, the method generates commands for the controllers 150 and 160 to move the actuators as a function of time.

The total motion of the system following the reference trajectory is equal to the sum of the magnitudes of the incremental changes in position along the trajectory. In the x-coordinates, this is given by $$\sum_{i=2}^{N} |x_{slow,i} - x_{slow,i-1}|.$$

To minimize the amount of motion, a minimal-motion trajectory needs change only when necessary. Without the constraints, a straight-line trajectory connecting two points is sufficient to satisfy this requirement. However, when a straight line trajectory violates the constraint, the trajectory has to be modified minimally in order to surmount this constraint. In some embodiments, the constraints are defined by the shape of the envelope. The regions outside of the envelope are viewed as obstacles and the trajectory must be modified in order to avoid these regions. The minimal modification is one that just barely surmounts the obstacle.

Some embodiments are based on realization that all minimal-motion trajectories are a combination of two extreme types of minimal-motion trajectories: a forward-looking trajectory and a backward-looking trajectory. A system following the forward-looking trajectory moves through the envelope anticipating any obstacles ahead and moves into position to avoid them as soon as possible. A system following the backward-looking trajectory moves through the envelope moving into position to avoid obstacles as it encounters them.

Figure 3A:
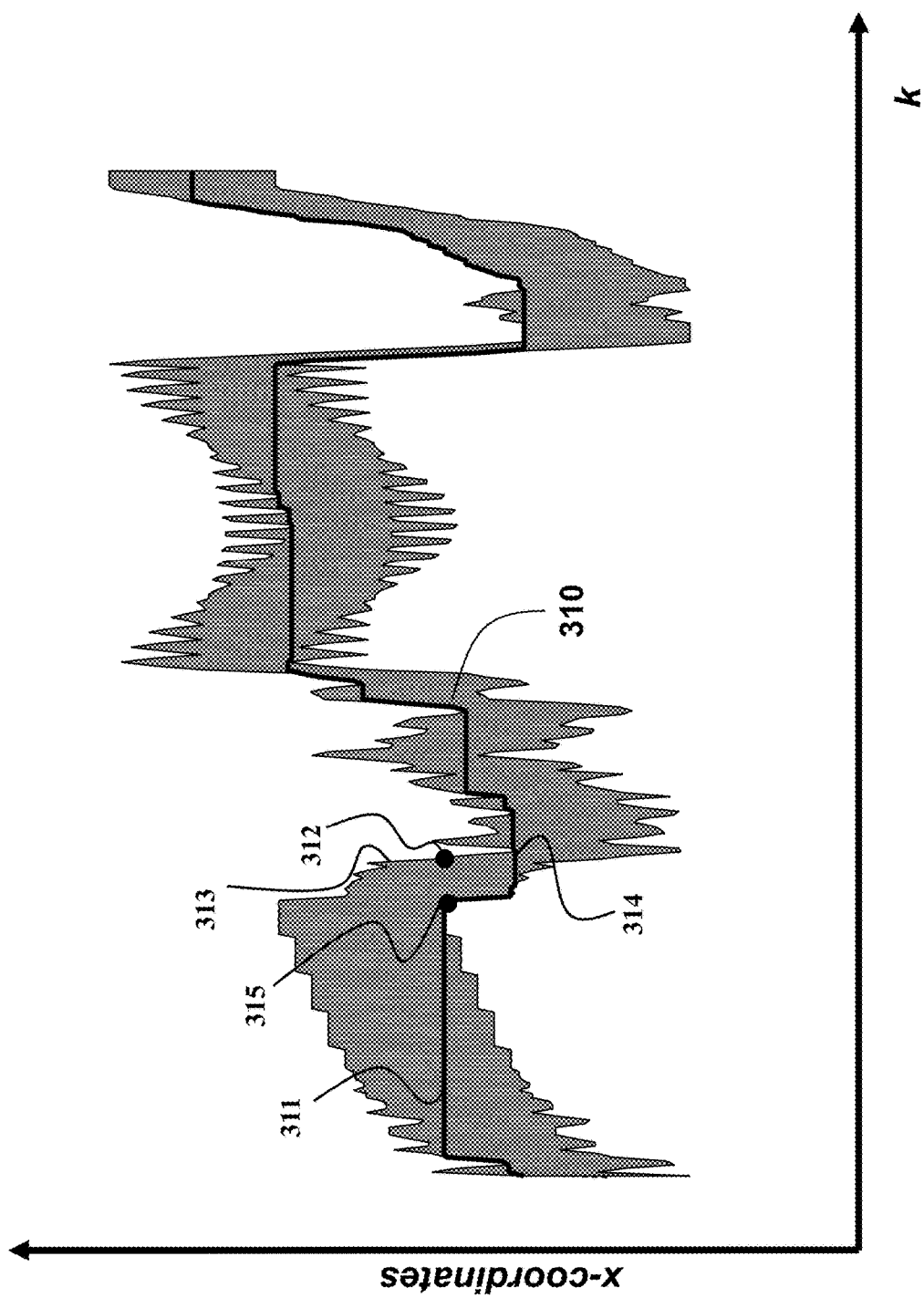
FIG. 3A shows an example of a forward-looking trajectory according to some embodiments.
Figure 3B:
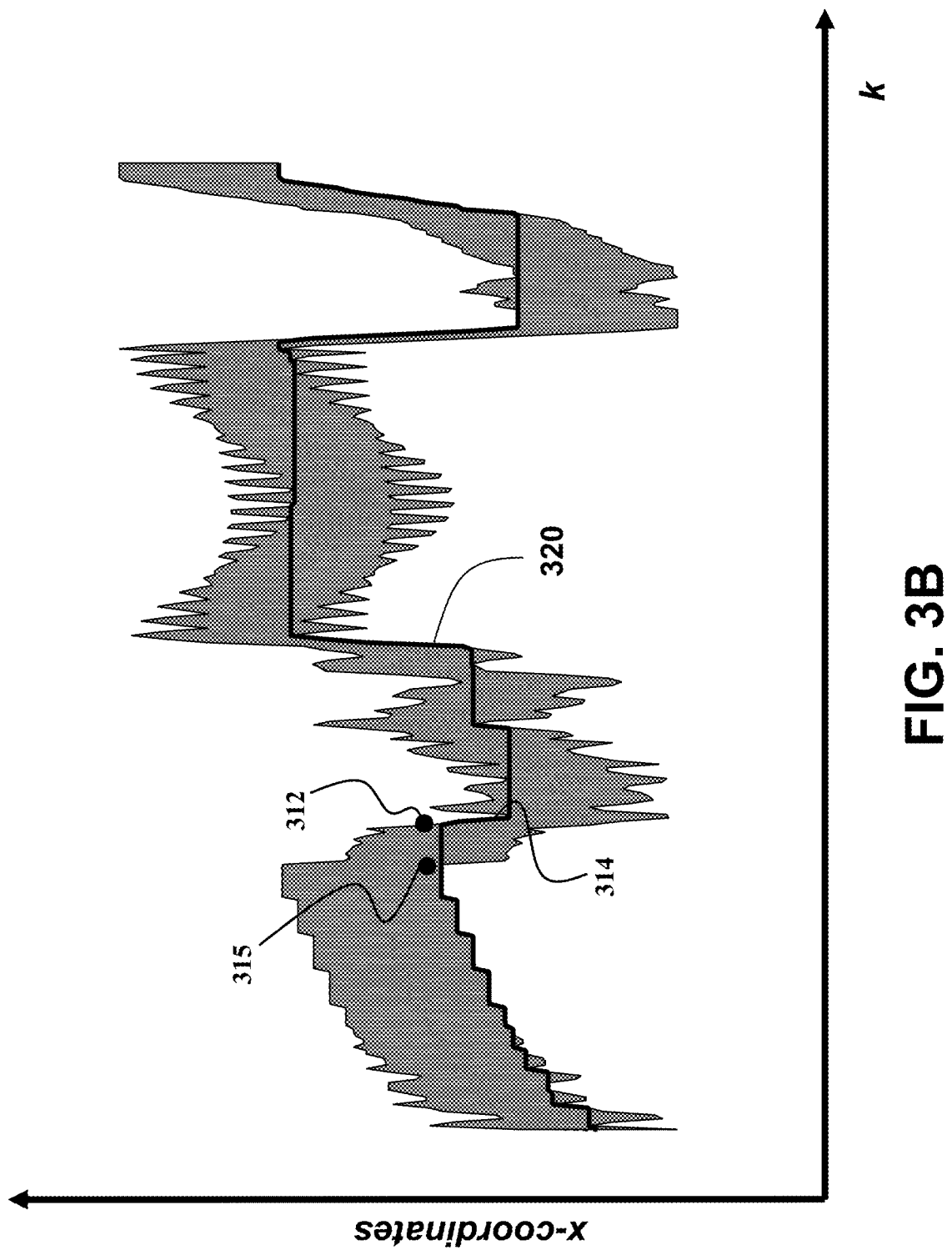
FIG. 3B shows an example of a backward-looking trajectory according to some embodiments.

FIG. 3A shows an example of a forward-looking trajectory 310 and FIG. 3B shows an example of a backward-looking trajectory 320 according to some embodiments. Both trajectories move the slow actuator only when required by the shape of the envelope. For example, at the segment of 311, the straight portion of the reference trajectories indicates that the slow actuator stays stationary at least according to x-coordinates. The next segment of the trajectory 310 when the slow actuator is stationary is the segment 314. The forward-looking trajectory 310 connects or switch between segments 311 and 314 only because its required by the border 313 of the shape of the envelope.

However, the forward-looking trajectory moves the slow actuator between two neighboring stationary positions as soon as possible. To that end, the forward-looking trajectory starts moving to the segment 314 at its first opportunity, i.e., the point 315. In contrast, the backward-looking trajectory moves the slow actuator between the two neighboring stationary positions as late as possible. To that end, the backward-looking trajectory starts moving to the segment 314 at its last opportunity, i.e., the point 312, as shown in FIG. 3B.

Figure 3C:
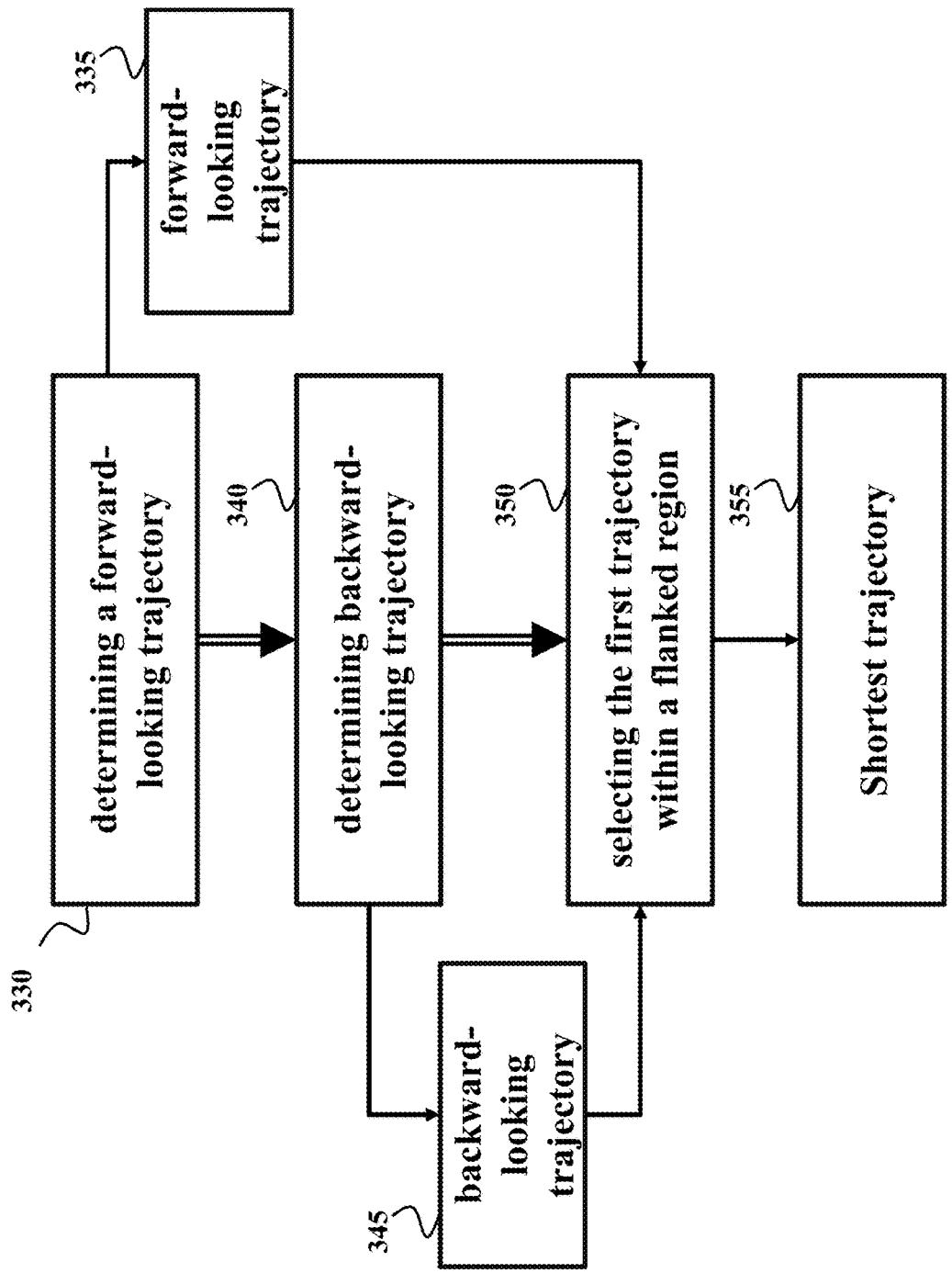
FIG. 3C shows a flowchart of a method for selecting the first trajectory of the slow actuator minimizing its motion according to one embodiment.

FIG. 3C shows a flowchart of a method for selecting the first trajectory of the slow actuator minimizing its motion according to one embodiment. The method determines 330 a forward-looking trajectory 335 moving the slow actuator between two neighboring stationary positions as soon as possible and determines 340 a backward-looking trajectory 345 moving the slow actuator between the two neighboring stationary positions as late as possible. Next, the method selects 350 the first trajectory within a region flanked by the forward-looking 335 and the backward-looking 345 trajectories as a monotonic function of time.

Figure 4A:
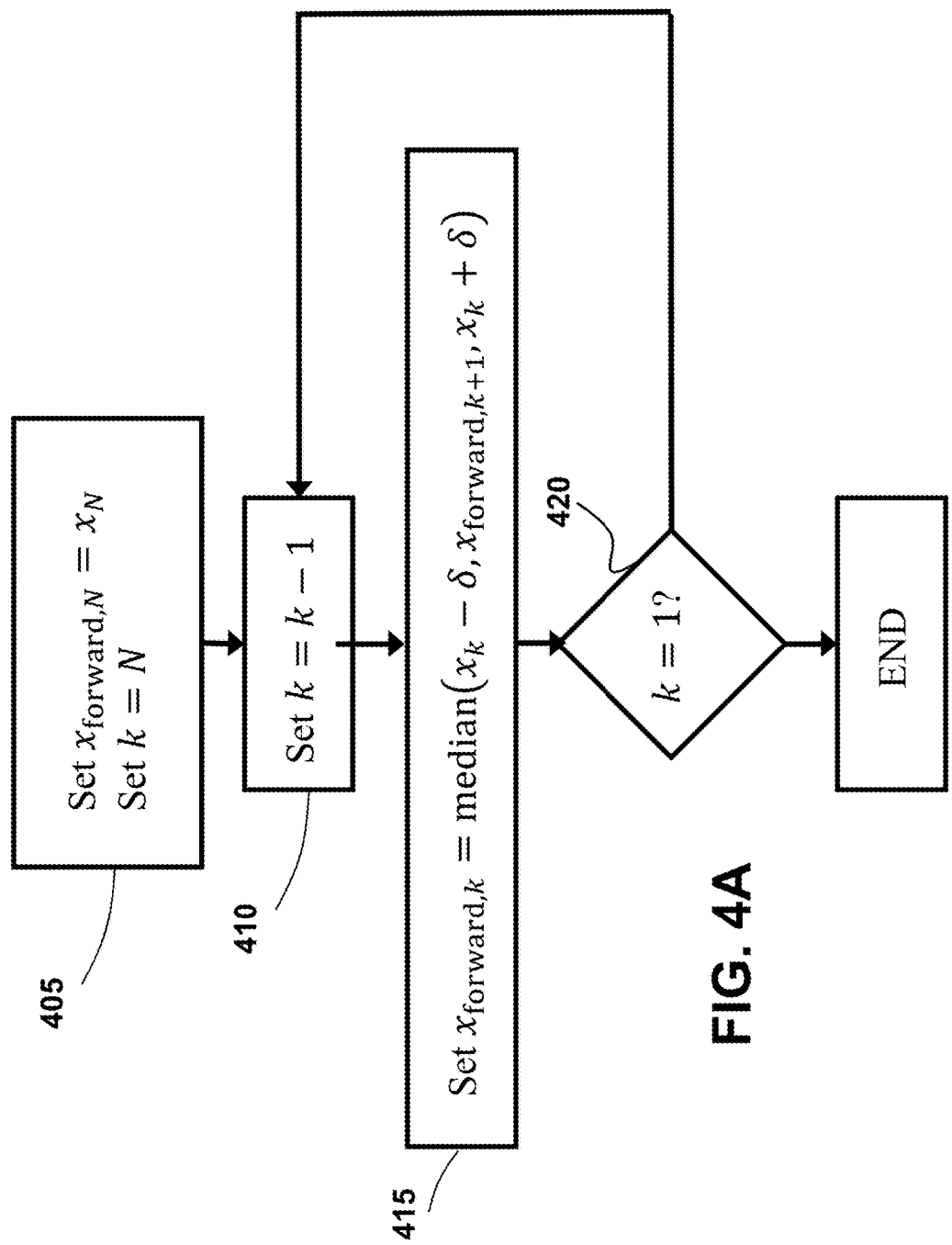
FIG. 4A shows a flowchart of a method for computing the forward-looking trajectory according to one embodiment.

FIG. 4A shows a flowchart of a method for computing the forward-looking trajectory according to one embodiment. To compute the forward-looking trajectory, the embodiments sets 405 the final point of the forward-looking trajectory $x_{forward,N}$ to be equal the final point of the reference trajectory $x_N$ and the current index k to N. Next, the embodiments decrements k 410 and sets 415 the point of the forward-looking trajectory $x_{forward,k}$ to the median of $x_k-\delta$, $x_{forward,k+1}$, and $x_k+\delta$. In this way, the value of $x_{forward,k}$ is equal to $x_{forward,k+1}$, implying that no motion occurs in the time-span from k to k+1, unless $x_{forward,k+1}$ does not satisfy the stroke constraint, wherein the value $x_{forward,k}$ is set to the value closest to $x_{forward,k+1}$ that satisfies the stroke constraint, implying that minimal motion occurs in the time-span from k to k+1. The steps 410 and 415 are repeated until 420 k=1, at which point the forward-looking trajectory is outputted.

Figure 4B:
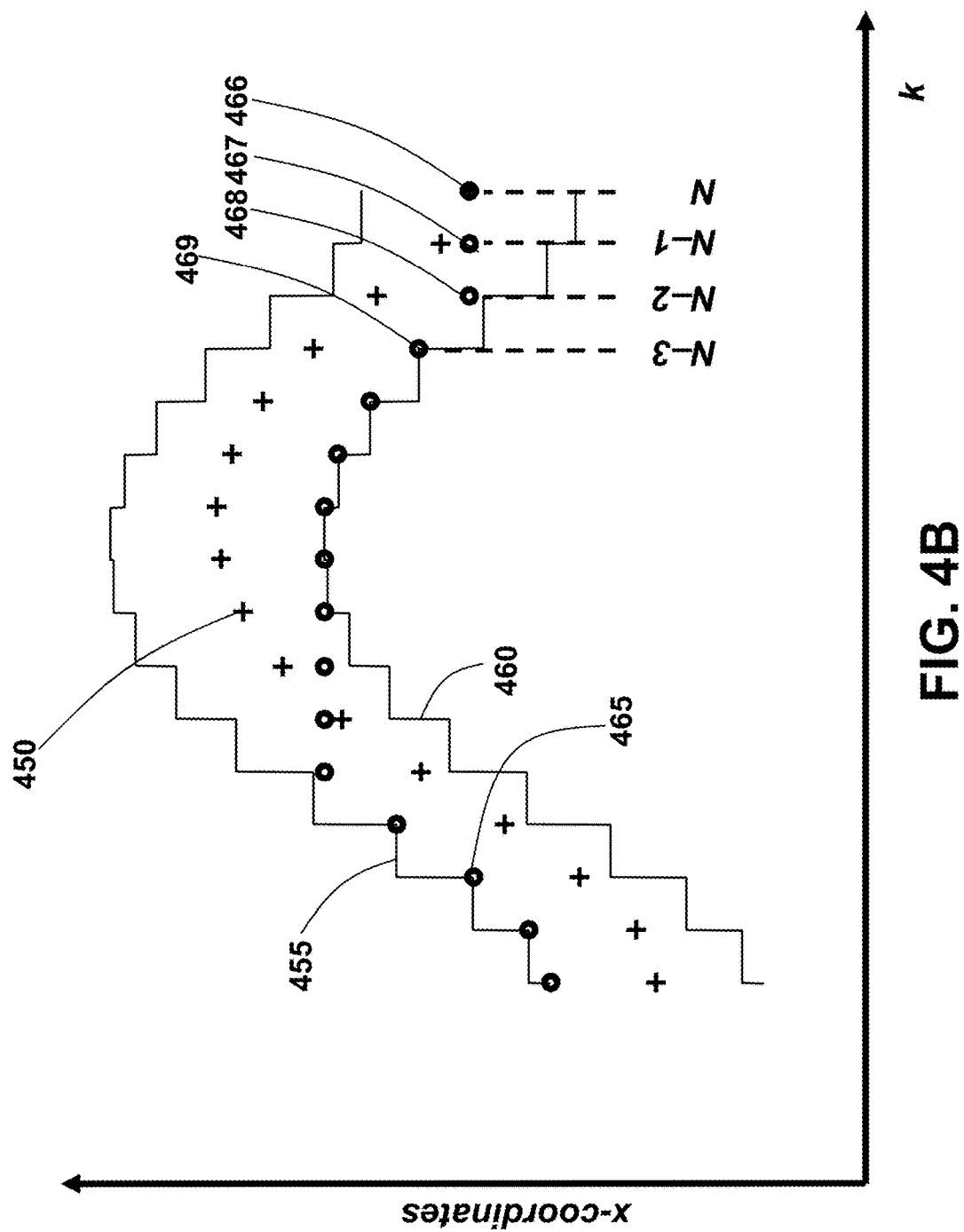
FIG. 4B shows a schematic illustrating the computation of FIG. 4A.

FIG. 4B shows a schematic illustrating the computation of FIG. 4A. In the FIG. 4B, the sequence of points 450 marked with a + are the points on the reference trajectory. The upper stroke constraint 455 and the lower stroke constraint 460 are given by solid lines. The forward-looking minimal-motion trajectory 465 is given by points marked by circles. In the following, an example of the first few steps in the computation of a forward-looking minimal-motion trajectory is presented. For the first step 405 of the algorithm, the point 466 corresponding to the final point of the forward-looking trajectory $x_{forward,N}$ is set to the final point of the spot reference trajectory. In the next step 410 k is decremented to N−1.

In the next step 415, the point 467 corresponding to $x_{forward,N-1}$ is set to $x_{forward,N}$ because $x_{forward,N}$ satisfies the stroke constraint at k=N−1. In the next step 410 k is decremented to N−2. In the next step 415, the point 468 corresponding to $x_{forward,N-2}$ is set to $x_{forward,N-1}$ because $x_{forward,N-1}$ satisfies the stroke constraint at k=N−2. In the next step 410 k is decremented to N−3. In the next step 415, the point 469 corresponding to $x_{forward,N-3}$ is set to $x_{N-3}-\delta$ because $x_{forward,N-2}$ does not satisfy the stroke constraint at k=N−3 and $x_{N-3}-\delta$ is the closest point to $x_{forward,N-2}$ that does satisfy the constraint.

Figure 4C:
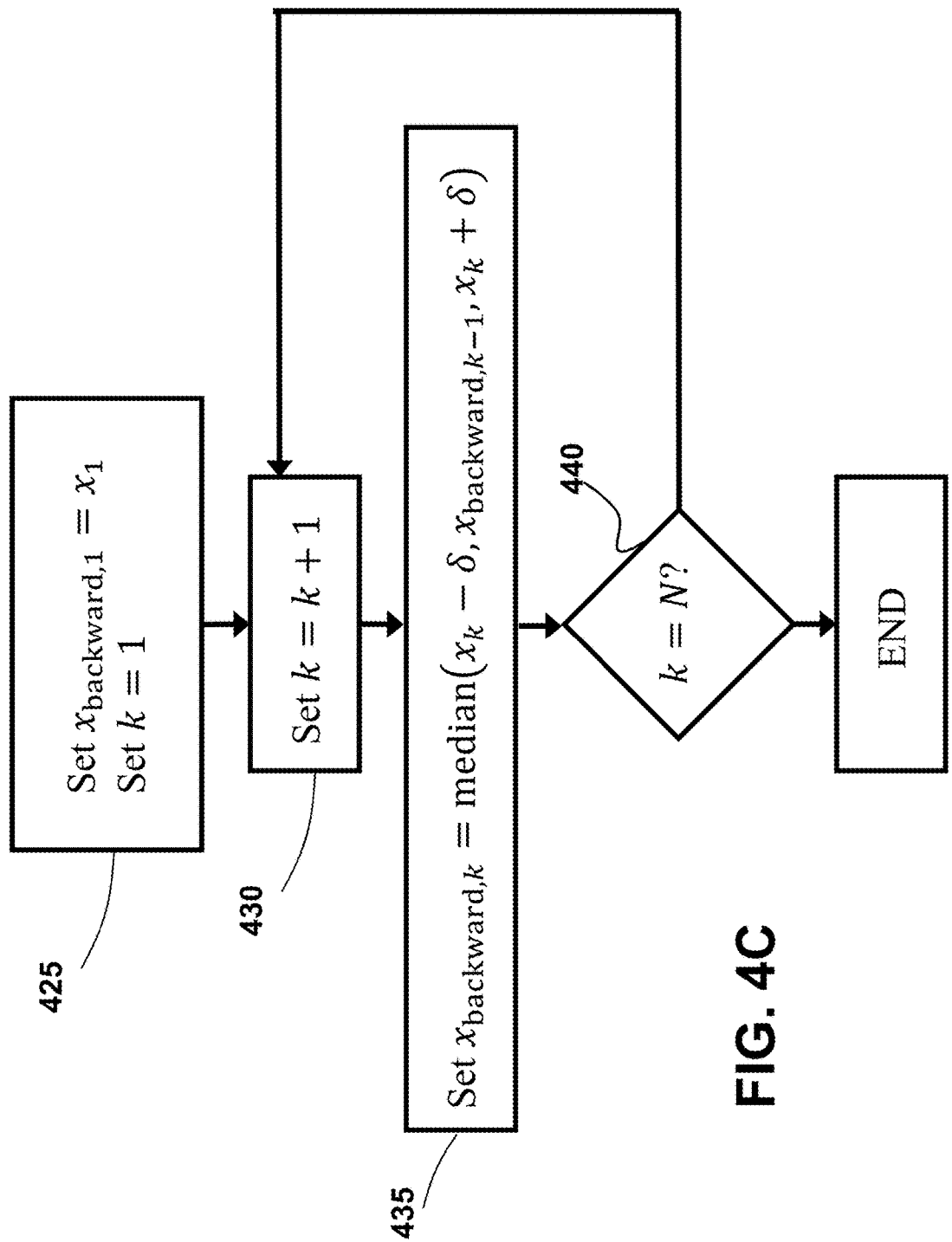
FIG. 4C shows a flow chart for computing the forward-looking trajectory according to one embodiment.

FIG. 4C shows a flow chart for computing the forward-looking trajectory according to one embodiment. To compute the backward-looking trajectory, the embodiments sets 425 the initial point of the forward-looking trajectory $x_{backward,1}$ to be equal the initial point of the spot-reference trajectory $x_1$ and the current index k to 1. The embodiment increments k 430 and sets 435 the point of the forward-looking trajectory $x_{backward,k}$ to the median of $x_k-\delta$, $x_{backward,k-1}$, and $x_k+\delta$. In this way, the value of $x_{backward,k}$ is equal to $x_{backward,k-1}$, implying that no motion occurs in the time-span from k−1 to k, unless $x_{backward,k-1}$ does not satisfy the stroke constraint, wherein the value $x_{backward,k}$ is set to the value closest to $x_{backward,k-1}$ that satisfies the stroke constraint, implying that minimal motion will occur in the time-span from k−1 to k. The steps 430 and 435 are repeated until 440 k=N, at which point the algorithm stops as the backward-looking trajectory has been computed.

Figure 4D:
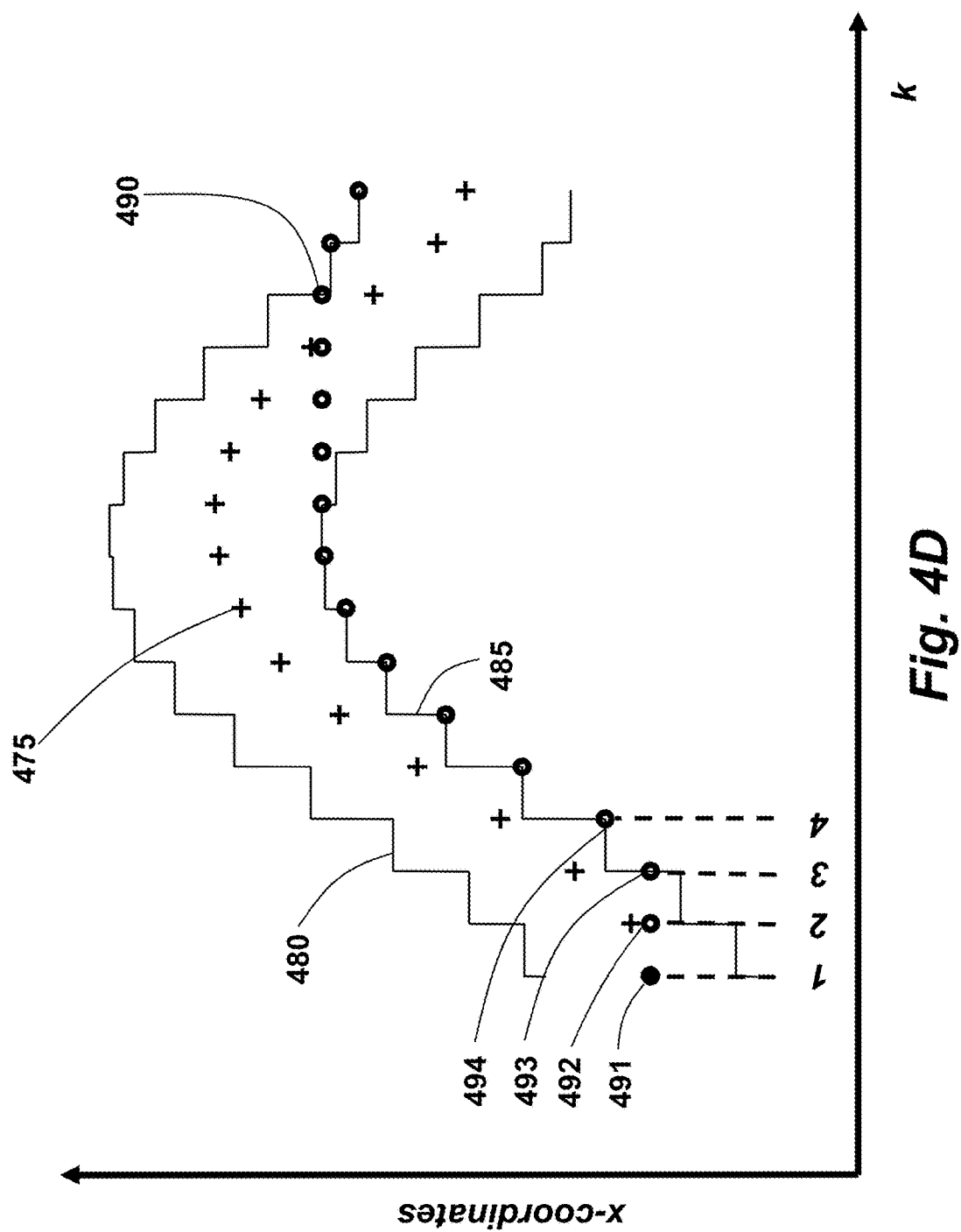
FIG. 4D shows a schematic illustrating the computation of FIG. 4C.

FIG. 4D shows a schematic illustrating the computation of FIG. 4C. In the FIG. 4D, the sequence of points 475 marked with a + are the spot reference trajectory. The upper stroke constraint 480 and the lower stroke constraint 485 are given by solid lines. The backward-looking minimal-motion trajectory 490 is given by points marked by circles. In the following, an example of the first few steps in the computation of a backward-looking minimal-motion trajectory is presented.

For the first step 425 of the computation, the point 491 corresponding to the initial point of the backward-looking trajectory $x_{backward,1}$ is set to the initial point of the spot reference trajectory. In the next step 430 k is incremented to 2. In the next step 435, the point 492 corresponding to $x_{backward,2}$ is set to $x_{backward,1}$ because $x_{backward,1}$ satisfies the stroke constraint at k=2. In the next step 430 k is incremented to 3. In the next step 435, the point 493 corresponding to $x_{backward,3}$ is set to $x_{backward,2}$ because $x_{backward,2}$ satisfies the stroke constraint at k=3. In the next step 430 k is incremented to 4. In the next step 435, the point 494 corresponding to $x_{backward,4}$ is set to $x_4-\delta$ because $x_{backward,3}$ does not satisfy the stroke constraint at k=4 and $x_4-\delta$ is the closest point to $x_{backward,3}$ that does satisfy the constraint.

The abovementioned examples of minimal-motion trajectories are the extreme examples of minimal-motion trajectories. There are a number of other different minimal-motion trajectories within a region flanked by the forward-looking and the backward-looking trajectories. Those trajectories are monotonic functions of time so that the motion never backtracks unnecessarily, i.e., until an obstacle has been surmounted.

Figure 5:
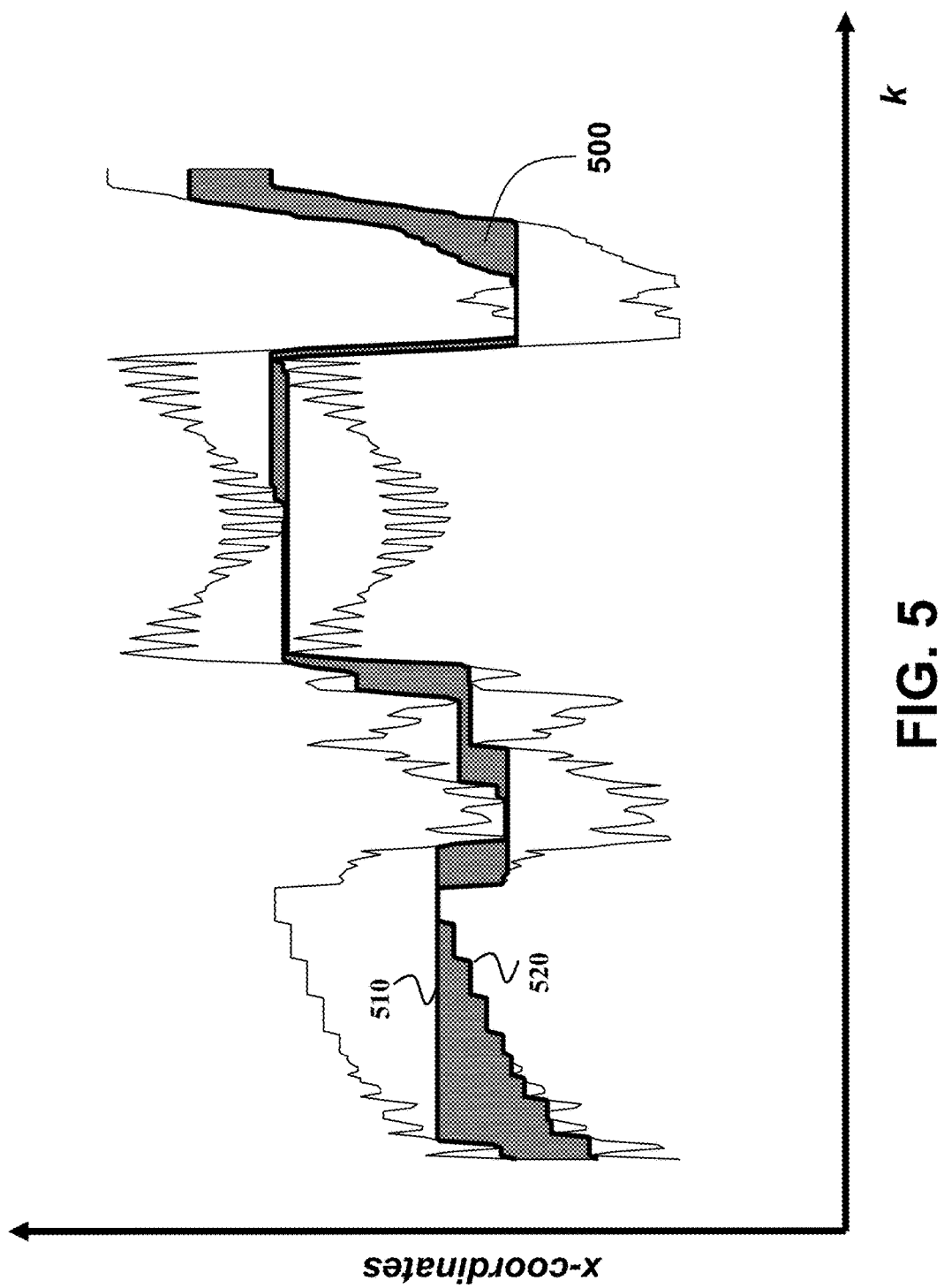
FIG. 5 shows an example of the region flanked by the forward-looking and the backward-looking trajectories according to some embodiments.

FIG. 5 shows an example of the region 500 flanked by the forward-looking and the backward-looking trajectories 510 and 520 according to some embodiments. Some embodiments select the minimal-motion trajectories located within the region 500 as a monotonic function satisfying this requirement $$x_{backward,k} \leq x_{MM,k} \leq x_{forward,k}; \quad (1)$$

$$x_{MM,k} = x_{MM,k-1} + \beta(x_{forward,k} - x_{MM,k-1}), \ 0 \leq \beta \leq 1. \quad (2)$$

where $x_{MM,k}$ represents points of a minimal-motion trajectory, and β is a scalar between 0 and 1. Property (1) guarantees that the minimal motion trajectory is between the forward-looking and the backward-looking trajectories. Property (2) guarantees that the minimal motion trajectory never backtracks unnecessarily. In particular, the forward-looking trajectory is one for which β is held constant at 1. The backward-looking trajectory is one for which β is held at the smallest possible nonnegative value under property (2).

Figure 6:
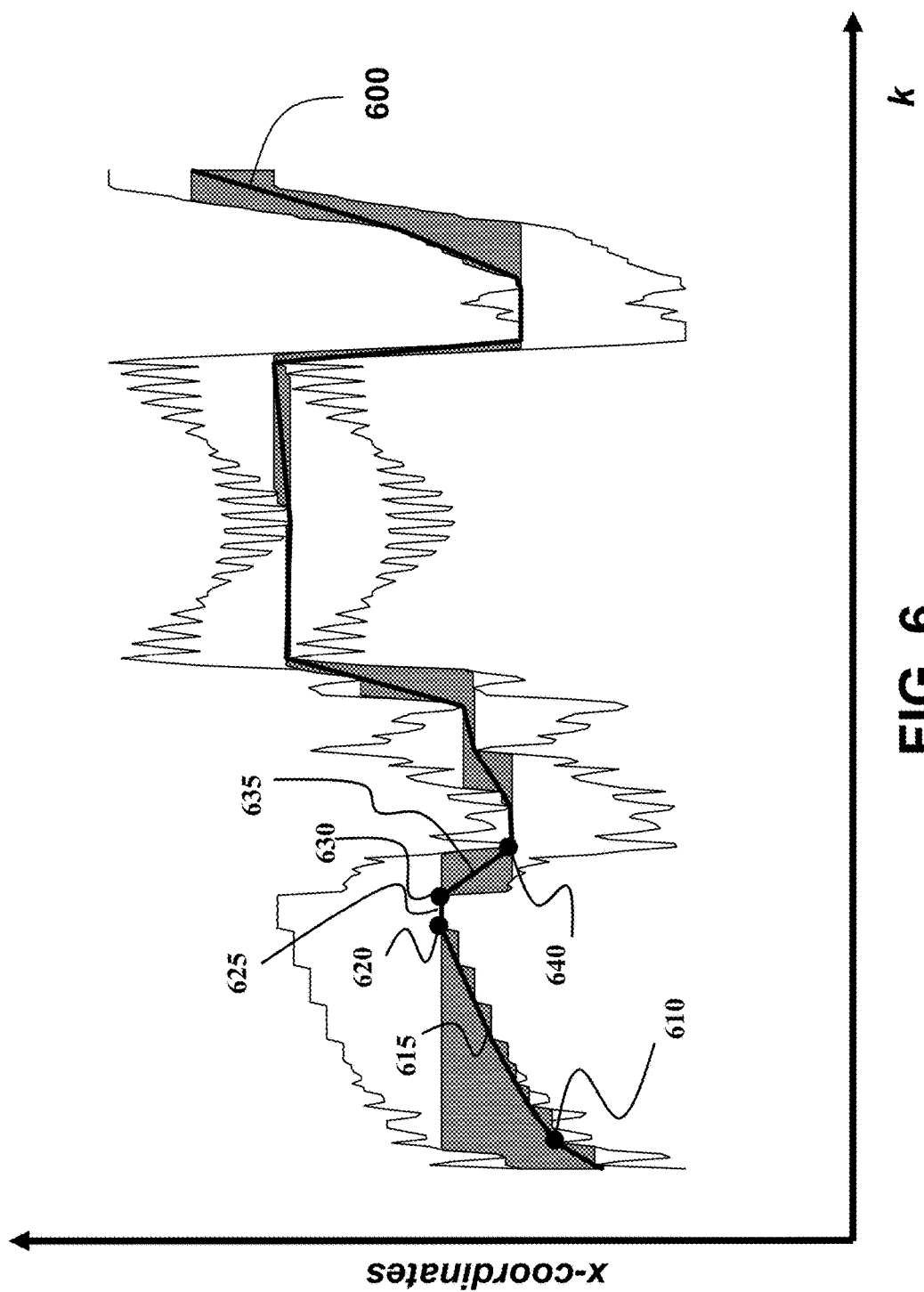
FIG. 6 shows an exemplar of selecting a minimal-motion trajectory within the region of FIG. 5 according to one embodiment.

FIG. 6 shows an exemplar minimal-motion trajectory 600 selected within the region 500 flanked by the forward-looking and the backward-looking trajectories according to one embodiment. In this embodiment, the trajectory generator minimizes a rate of change of the first trajectory. This particular choice of trajectory can be beneficial when smooth transitions are desired.

In some implementations, the minimization of the rate of change of the first trajectory of the slow actuator is performed iteratively. An iteration includes selecting, originated at a point on the reference trajectory received from a previous iteration, the longest straight segment traversing the region flanked by the forward-looking and the backward-looking trajectories as the monotonic function of time and passing a point of intersection of the longest straight segment with the reference trajectory to a subsequent iteration. For example, for a point 610, the embodiment selects the longest straight segment 615, for a point 620 the embodiment selects the longest straight segment 615, and for a point 630 the embodiment selects the longest straight segment 635 passing the point 640 to the next iteration.

The description above has detailed the aspects of determining the minimal-motion trajectory for the x-axis. In various embodiments, similar steps are used to determine the minimal-motion trajectory for the y-axis; in general, these steps can be used to determine the minimal-motion trajectories on any number of axes.

Some embodiments can optionally modify a minimal-motion trajectory in order to achieve desired characteristics. Reasons for doing so may include, for example, to smooth out the motion. Smoothing out the motion can be achieved by the passing the trajectory through an optional smoothing filter or other type of controller 120 such as, for example, a low-pass filter. Additionally, or alternatively, one embodiment determines the first trajectory that avoids the edge of the envelope. The modification can be achieved by decreasing the value of δ below the physical limitations of the fast positioning subsystem, so that there is room for movement when following the minimal-motion trajectory.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different from illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A laser processing system for positioning a laser spot on a workpiece processed by the laser processing system according to a reference trajectory, comprising:
   redundant actuators including at least a first actuator and a second actuator arranged such that joint motions of the first actuator and the second actuator position the controlled parameter of the system, wherein dynamics of the second actuator is at least one order of magnitude faster than dynamics of the first actuator, wherein the second actuator is configured to direct the laser spot at different locations on the workpiece, and wherein the first actuator is configured to move the second actuator relative to the workpiece;
   a memory to store the reference trajectory including a sequence of points defining positions of the controlled parameter of the system as a function of time;
   a trajectory generator including a processor to determine a first trajectory of the first actuator minimizing the motion of the first actuator that positions the second actuator such that each point of the reference trajectory is within a range of the second actuator and to determine a second trajectory of the second actuator based on a difference between the reference trajectory and the positions the second actuator with respect to the reference trajectory governed by the first trajectory enabling the joint motions of the first actuator and the second actuator to position the laser spot: along the reference trajectory, wherein, for each axis of control, the processor determines an envelope bounding the first trajectory with respect to the reference trajectory in at least the axis of control and time domains, wherein the envelope is centered on the reference trajectory with a width not greater than the range of the second actuator, wherein the processor determines the shortest trajectory traversing the envelope along the time domain to produce the first trajectory, wherein the processor superimposes the range of the second actuator on each point of the reference trajectory to produce the envelope constraining the motion of the first actuator that precludes the first trajectory being the straight line along its entire length, and wherein the first trajectory includes a set of straight segments satisfying the constraints defined by the shape of the envelope;
   a first controller for controlling the motion of the first actuator according to the first trajectory; and
   a second controller for controlling the motion of the second actuator according to the second trajectory.

2. The system of claim 1, further comprising:
   a filter for smoothing the motion of the first actuator.

3. The system of claim 1, wherein the processor determines a forward-looking trajectory and a backward-looking trajectory and selects the first trajectory within a region flanked by the forward-looking and the backward-looking trajectories as a monotonic function of time, wherein the forward-looking and the backward-looking trajectories moves the first actuator only when required by the shape of the envelope, while the forward-looking trajectory moves the first actuator between two neighboring stationary positions as soon as possible, and wherein the backward-looking trajectory moves the first actuator between the two neighboring stationary positions as late as possible.

4. The system of claim 3, wherein the processor minimizes a rate of change of the first trajectory.

5. The system of claim 4, wherein the processor determines the first trajectory iteratively, wherein an iteration includes selecting, originated at a point on the reference trajectory received from a previous iteration, the longest straight segment traversing the region flanked by the forward-looking and the backward-looking trajectories as the monotonic function of time and passing a point of intersection of the longest straight segment with the reference trajectory to a subsequent iteration.

6. The system of claim 1, wherein the second actuator includes a galvano mirror assembly, and wherein the first actuator includes a platform configured to move in a plane to position the galvano mirror assembly relative to the workpiece.

7. The system of claim 6, wherein the laser processing machine system includes one or a combination of a laser drilling, a laser cutting, a laser marking, a laser scribing, a laser direct imaging, and an electron beam processing machine.

8. A method for controlling a joint motion of redundant actuators including a first actuator and a second actuator to position a controlled parameter according to a reference trajectory including a sequence of points defining positions of the controlled parameter of the system as a function of time, wherein the redundant actuators are part of a laser processing machine such that the controlled parameter is a position of a laser spot on a workpiece processed by the laser processing machine, wherein the second actuator is configured to direct the laser spot at different locations on the workpiece, and wherein the first actuator is configured to move the second actuator relative to the workpiece, wherein steps of the method are performed by a processor connected to a memory storing the reference trajectory and coupled with stored instructions implementing the method, wherein the instructions, when executed by the processor carry out at least some steps of the method comprising:
   determining, for an axis of control, an envelope bounding a first trajectory of the first actuator with respect to the reference trajectory in at least the axis of control and time domains, wherein the envelope is centered on the reference trajectory with a width not greater than a range of the second actuator;
   determining the shortest trajectory traversing the envelope along the time domain to produce the first trajectory of the first actuator, wherein determining the first trajectory comprises:
   determining a forward-looking trajectory and a backward-looking trajectory moving the first actuator only when required by the shape of the envelope, wherein the forward-looking trajectory moves the first actuator between two neighboring stationary positions as soon as possible, and wherein the backward-looking trajectory moves the first actuator between the two neighboring stationary positions as late as possible; and
   selecting the first trajectory within a region flanked by the forward-looking and the backward-looking trajectories as a monotonic function of time;
   determining a second trajectory of the second actuator based on a difference between the reference trajectory and the positions the second actuator with respect to the reference trajectory governed by the first trajectory enabling the joint motions of the first actuator and the second actuator to position the controlled parameter of the system along the reference trajectory; and
   causing the first actuator to move according to the first trajectory and causing the second actuator to move according to the second trajectory.

9. The method of claim 8, wherein determining the first trajectory comprises:
determining a forward-looking trajectory and a backward-looking trajectory moving the first actuator only when required by the shape of the envelope, wherein the forward-looking trajectory moves the first actuator between two neighboring stationary positions as soon as possible, and wherein the backward-looking trajectory moves the first actuator between the two neighboring stationary positions as late as possible; and
selecting the first trajectory within a region flanked by the forward-looking and the backward-looking trajectories as a monotonic function of time.

10. The method of claim 9, wherein the selecting comprises:
minimizing a rate of change of the first trajectory.

11. The method of claim 10, the rate of change of the first trajectory is minimized iteratively, wherein an iteration comprises:
selecting, originated at a point on the reference trajectory received from a previous iteration, the longest straight segment traversing the region flanked by the forward-looking and the backward-looking trajectories as the monotonic function of time; and
passing a point of intersection of the longest straight segment with the reference trajectory to a subsequent iteration.

12. The method of claim 8, wherein the second actuator include a galvano mirror assembly, and wherein the first actuator is a platform configured to move in a plane to position the galvano mirror assembly relative to the workpiece.

13. The method of claim 12, wherein the laser processing machine includes one or a combination of a laser drilling, a laser cutting, a laser marking, a laser scribing, a laser direct imaging, and an electron beam processing machine.

14. A non-transitory computer readable storage medium embodied thereon a program executable by a processor for performing a method for controlling a joint motion of redundant actuators including a first actuator and a second actuator to position a controlled parameter according to a reference trajectory including a sequence of points defining positions of the controlled parameter of the system as a function of time, wherein the redundant actuators are part of a laser processing machine such that the controlled parameter is a position of a laser spot on a workpiece processed by the laser processing machine, wherein the second actuator include a galvano mirror assembly to direct the laser spot at different locations on the workpiece, and wherein the first actuator is a platform configured to move in a plane to position the galvano mirror assembly relative to the workpiece, the method comprising:
determining, for an axis of control, an envelope bounding a first trajectory of the first actuator with respect to the reference trajectory in at least the axis of control and time domains, wherein the envelope is centered on the reference trajectory with a width not greater than a range of the second actuator;
determining the shortest trajectory traversing the envelope along the time domain to produce the first trajectory of the first actuator, wherein determining the first trajectory comprises:
determining a forward-looking trajectory and a backward-looking trajectory moving the first actuator only when required by the shape of the envelope, wherein the forward-looking trajectory moves the first actuator between two neighboring stationary positions as soon as possible, and wherein the backward-looking trajectory moves the first actuator between the two neighboring stationary positions as late as possible; and
selecting the first trajectory within a region flanked by the forward-looking and the backward-looking trajectories as a monotonic function of time;
determining a second trajectory of the second actuator based on a difference between the reference trajectory and the positions the second actuator with respect to the reference trajectory governed by the first trajectory enabling the joint motions of the first actuator and the second actuator to position the controlled parameter of the system along the reference trajectory; and
causing the first actuator to move according to the first trajectory and causing the second actuator to move according to the second trajectory.

15. The storage medium of claim 14, wherein the method iteratively reduces a rate of change of the first trajectory, wherein an iteration comprises:
selecting, originated at a point on the reference trajectory received from a previous iteration, the longest straight segment traversing the region flanked by the forward-looking and the backward-looking trajectories as the monotonic function of time; and
passing a point of intersection of the longest straight segment with the reference trajectory to a subsequent iteration.

* * * * *